United States Patent [19]
Eustis et al.

[11] Patent Number: 6,038,179
[45] Date of Patent: Mar. 14, 2000

[54] MULTIPLE REPAIR SIZE REDUNDANCY

[75] Inventors: Steven Michael Eustis; Cheryl Jean Herdey, both of Essex Junction; Eric Stephen Machat, Jericho; Dale Edward Pontius; Endre Philip Thoma, both of Colchester, all of Vt.

[73] Assignee: International Business Machines Corp., Armonk, N.Y.

[21] Appl. No.: 09/224,776

[22] Filed: Jan. 4, 1999

[51] Int. Cl.[7] ............................................. G11C 7/00
[52] U.S. Cl. ..................................... 365/200; 365/230.03
[58] Field of Search .................................. 365/200, 201, 365/230.03, 230.06

[56] References Cited

U.S. PATENT DOCUMENTS

| | | |
|---|---|---|
| 5,260,902 | 11/1993 | Pilling et al. . |
| 5,281,868 | 1/1994 | Morgan . |
| 5,295,101 | 3/1994 | Stephens, Jr. et al. . |
| 5,422,850 | 6/1995 | Sukegawa et al. . |
| 5,487,040 | 1/1996 | Sukegawa et al. . |
| 5,894,441 | 4/1999 | Nakazawa et al. ..................... 365/200 |

*Primary Examiner*—David Nelms
*Assistant Examiner*—David Lam
*Attorney, Agent, or Firm*—Whitham, Curtis & Whitham; Robert A. Walsh

[57] ABSTRACT

A Random Access Memory including a redundancy scheme wherein redundant memory elements are organized in a mixture of redundancy patches of various sizes, i.e., various number of word/bit lines in each patch. The number of lines, e.g., 1, 2, 4 or 8 word or bit lines, in each of the patches is selected as appropriate with many different sized patches existing within the same redundancy reservoir. The size the particular patch selected depends on the size of the replaced defect detected during programming.

7 Claims, 3 Drawing Sheets

MULTIPLE REPAIR SIZE REDUNDANCY

BACKGROUND OF THE INVENTION

1. Field of the Invention

The present invention generally relates to Random Access Memory (RAM) Arrays and more particularly to redundancy for RAM arrays.

2. Background Description

Redundancy schemes for repairing defective array areas in Random Access Memory (RAM) arrays are well known to improve chip manufacturing yield. Typically, prior art RAM redundancy techniques include providing additional array rows and/or columns (i.e., array word lines and bit lines) on each RAM chip for replacing defective array rows or columns.

Fuses, located strategically around the chip, select redundant cells and deselect defective array portions. These fuses are typically much larger than memory cells and, may even be larger than the redundant rows/columns that they select. So, depending on the amount of redundancy, i.e., the number of redundant rows and columns included and, the number of fuses required to select them, chip fuse area may be a significant portion of total chip area.

One primary goal in improving RAM chip density is shrinking chip size. However, as chip density increases, both reducing chip sizes and increasing memory array capacity, it has become increasingly difficult to provide adequate space for existing chip redundancy schemes.

Consequently, to reduce chip area assigned to fuses without reducing the spare cell area state of the art chips assign multiple redundant lines to each available repair unit, i.e., multiple rows or columns are repaired with any single repair, e.g., in pairs or groups of four.

So, for example, replacing pairs of defective lines with redundant elements, individual elements in the pair can be distinguished by the least significant address pin. Thus, if the word/bit line at row/column address 10000000000 is replaced by a redundant element, then, the word/bit line at row/column address 10000000001 is replaced, also. Likewise, if groups of 4 elements are replaced, then each defective unit is identified by the next to least significant address pin. In this example, if a word/bit line at row/column address 1000000 is identified as defective, then, the redundant unit also replaces word/bit lines at row/column address's 1000001, 1000010, and 1000011.

In these prior art schemes, fuses are blown to replace the defective elements with redundant units and, the number of fuses blown depends on array patch size and how many address bits are necessary for decoding and rerouting the defective address. This solution is effective when an array defect affects several adjacent rows or columns.

Unfortunately, if only a single row or column or something less than the multiple is defective, then the extra redundant elements that are also assigned are wasted. Further, these prior art redundancy schemes have been limited to a predetermined amount of replacement.

Thus, there is a need for a flexible redundancy scheme that reduces the number of fuses necessary for programming and the amount of wasted array space, without reducing the percentage of repairable defects and, therefore, chip yield.

SUMMARY OF THE INVENTION

It is therefore a purpose of the present invention to reduce the space necessary for including redundancy in random access memory;

It is another purpose of the present invention to reduce the number of fuses necessary for programming redundant memory array units;

It is yet another purpose of the present invention to reduce the number of fuses necessary for programming redundant memory array units without reducing chip yield;

It is yet another purpose of the present invention to reduce the number of fuses necessary for programming redundant memory array units without reducing the percentage of repairable defects.

The present invention is an integrated circuit chip including a redundancy scheme wherein redundant memory elements are organized in a mixture of redundancy patches of various sizes; i.e., various number of word/bit lines in each patch, selected as appropriate. The size the particular patch selected depends on the size of the replaced defect detected during programming.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
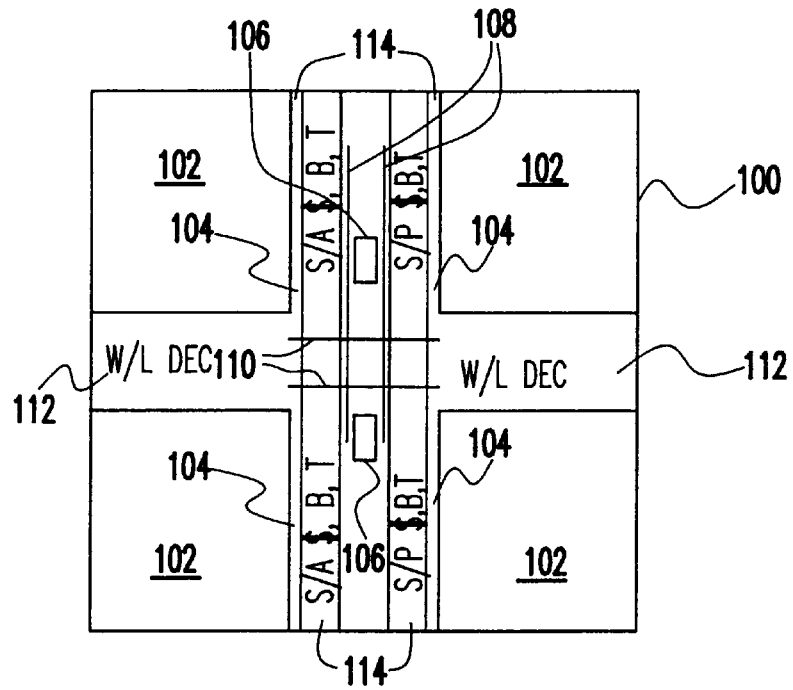
FIG. 1 is an example of a preferred embodiment memory chip.

Referring now to the drawings, and more particularly to FIG. 1, which is an example of a preferred embodiment memory chip 100. The memory chip of this example includes four sub-arrays 102, each with spare word lines in a redundancy section 104.

Word line redundancy is described herein for purposes of example only, and is not intended as a limitation. The present example could easily be applied to a RAM chip with bit line redundancy or to a RAM chip including both bit line and word line redundancy. Further, it is intended that redundant cells in individual sub-arrays 102, may be used to correct defects in other sub-arrays 102, if necessary.

In the chip 100 of the present example, fuses are isolated in windows 106 between address busses 108 and above and below address busses 1 10. Word lines run vertically through sub-arrays 102 and are selected by decoders 112 between sub-arrays. Bit lines run horizontally through the sub-arrays 102 and are selected and sensed by sense amplifiers in bit decode sections 114.

Figure 2:
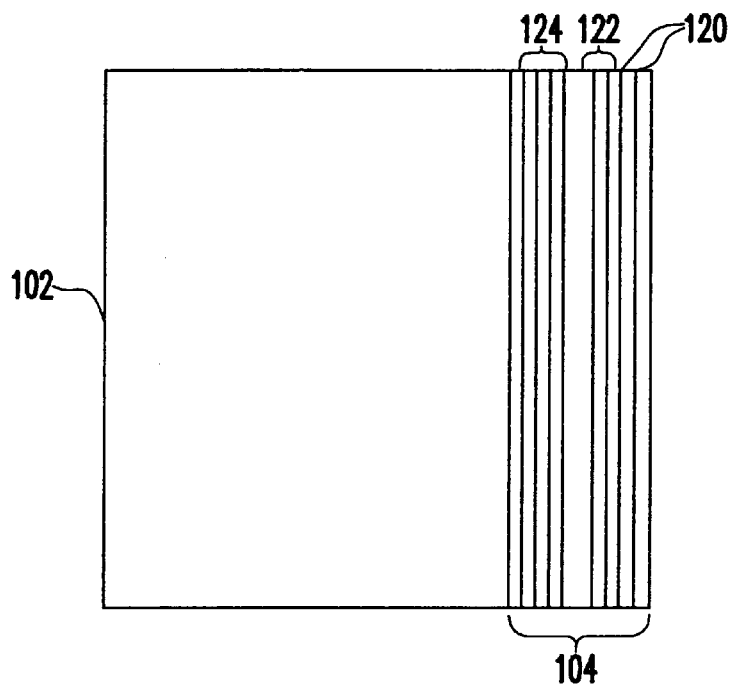
FIG. 2 shows a sub-array of the preferred embodiment memory chip of FIG. 1 having a mixture of redundancy patches of various sizes in redundancy section.

As can be seen from FIG. 2, the preferred embodiment approach is to include a mixture of redundancy patches of various sizes in redundancy section 104, selected as appropriate. In this example, there are two (2) individually selectable word lines 120, one selectable pair of word lines 122 and one selectable group of four (4) word lines 124.

Thus, a single defective line may be replaced by a single element 120. However, a defect affecting several adjacent word lines, instead of being replaced by several individual elements, may be replaced a single larger patch, e.g., patch 122 or 124. The number of fuses required to select the patch would be roughly the same for both patches, the single element patch 120 and the multiple element single patches 122 and 124. Each of these preferred embodiment patches may be selected as large, e.g., 8 or 16, or as small (one line) as desired. Preferably, several different size patches are included on each chip as in the example of FIGS. 1 and 2, each ready for activation. The patch mix may be selected, for example, based on the likelihood of different defect sizes occurring; i.e., the probability of a defect affecting 1, 2, 4 or more adjacent bit or word lines.

Thus, because the preferred embodiment method requires, essentially, the same number of fuses to program each patch, regardless of size, there are fewer fuses per redundant line (word or bit) and, correspondingly, less chip area is dedicated to fuses 106 than traditional prior art individual line redundancy techniques. The number of fuses required on a prior art chip to select a particular number of individual lines, selects the same number of various sized patches on a preferred embodiment chip. Since the patches are not of a single uniform size, i.e., some may be smaller than others, there are fewer wasted cells on a preferred embodiment chip than on traditional prior art chips relying on the multiple line redundancy techniques.

Typically, redundancy algorithms deal with only one size of redundancy selection. The redundancy algorithm must be modified to reflect that various sizes of redundancy patches are available. One technique is to use a standard algorithm that finds redundancy solutions that would work if we had the entire redundant area available using only the smallest size patch to cover the entire area. If a solution did exist with the use of various size redundancy patches, that solution would be a subset of the solutions found using only the smallest size patch. By filtering through all the solutions found using only the smallest size patch, we could find the solution, if it exists, that could be used to reflect the use of the various sizes of redundancy patches.

Figure 3:
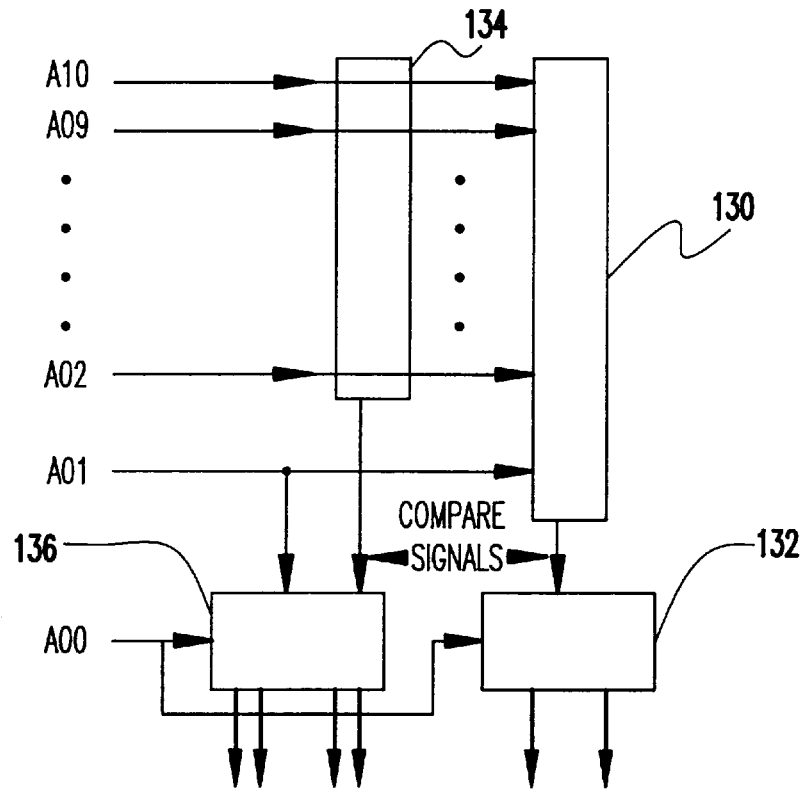
FIG. 3 is an example of two preferred embodiment patch redundancy selection circuits for selecting between lines in a pair of replacement lines and one of four lines of a four (4) line patch group.

FIG. 3 is an example of two patch redundancy selection circuits for selecting between lines in a pair of replacement lines 122 and one of four lines of a four (4) line patch group 124. Programmed decoder 130 selects the pair of replacement lines 122 and address line A0 selects individual lines of the pair 122 by selecting the appropriate output of 1:2 demultiplexor 132. Programmed decoder 134 selects the group of four replacement lines 124 and address lines A0 and A1 select individual lines of the group 124 by driving the appropriate output of 2:4 demultiplexor 136. Accordingly, a group of 8 redundant elements could be selected using an appropriate decoder and with A2, A1 and A0 selecting an appropriate output of a 3:8 demultiplexor.

Figure 4:
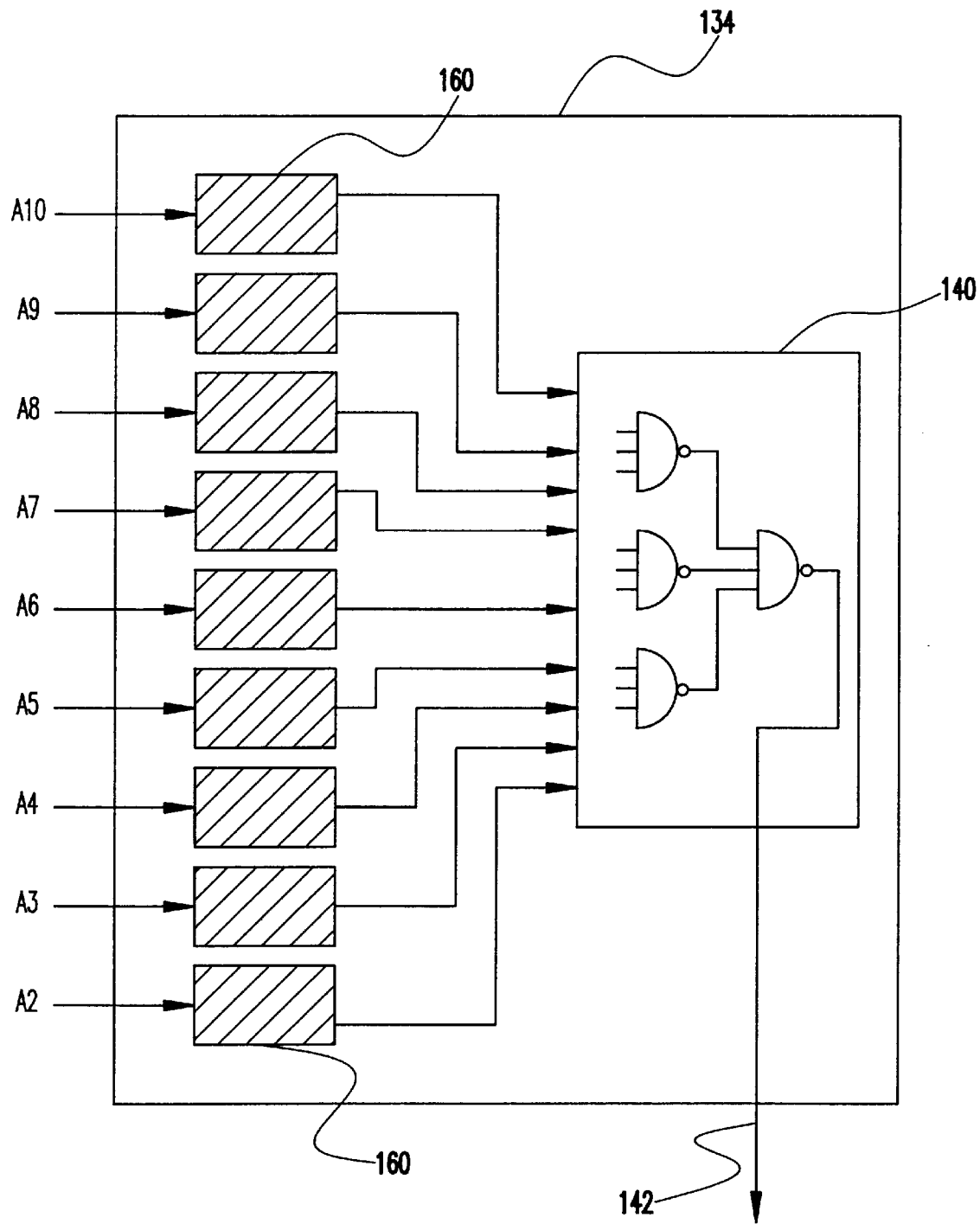
FIG. 4 is an example of a programmed decoder of FIG. 3.

FIG. 4 is an example of a programmed decoder 134. In this group of four decoder, AND gate 140 combines the outputs of nine 9 identical programmable elements 150 to generate select signal 142. Each of the programmable elements 150 receives an address input A2–A10. Depending upon the state of a corresponding fuse, the particular programmable either inverts the input, or passes the input A2–A10 uninverted to AND gate 140. The compare signal 142 out of AND gate 140 is passed to 2:4 demultiplexor 136. As indicated above, depending on the state of A1 and A0, 2:4 demultiplexor 136 passes the compare signal 142 out on the appropriate one of its four outputs.

Figure 5:
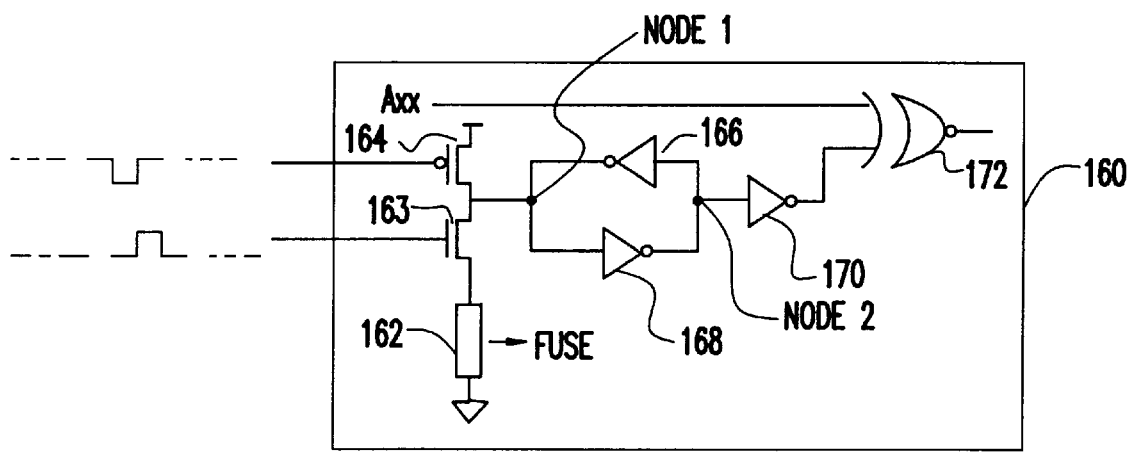
FIG. 5 is a example of a fuse programmable element.

FIG. 5 is a example of a fuse programmable element 160. A fuse 162 between ground and series connected NFET 163 and PFET 164 programs the element. The output, taken from the common connected drains of FETs 163 and 164, is tied to node 1 on one side of cross-coupled inverters 166, 168, forming a latch which set dependant upon the state of fuse 162; i.e., whether or not fuse 162 has been blown. More particularly, at power on, a positive going pulse is applied to NFET 163 and a negative going pulse is applied to PFET 164. Node 1 is pulled high and will remain so if the fuse 162 is blown; however, if the fuse 162 is not blown, node 1 then becomes low and remains so.

An inverter 170 connected to node 2 at the other side of cross-coupled inverters 166, 168, reflects the reflects the state of node 1 and is one input to EXNOR 172. EXNOR 172 combines an address input; e.g., A5, with the programmed level from inverter 170, passing the address input inverted or uninverted, depending upon the state of the fuse 162. Thus, if the fuse 162 is in place, the output of inverter 170 is low and, the address input is passed uninverted. If the fuse 162 is opened, i.e., it has been blown, then the output of inverter 170 is high and EXNOR 172 inverts its address input.

So, programming is done by selectively blowing fuses in programmable elements 160 such that, when the programmed address is passed to a programmed decoder, all programmable element 160 outputs are high. Programmed decoder 130 is identical to programmed decoder 134, except that it includes one additional programmable element 160 (for A1) and, AND gate 140 is a 10 input AND gate to combine all 10 outputs. Likewise a Programmed decoder for an eight line group includes one less programmable element 160 (omitting A2) and, AND gate 140 is an 8 input AND gate to combine all 8 outputs. Thus, single line and multiple line fails on a preferred embodiment RAM chip including the preferred redundancy repair scheme can be repaired much more efficiently than on prior art RAM chips.

While the invention has been described in terms of preferred embodiments, those skilled in the art will recognize that the invention can be practiced with modification within the spirit and scope of the appended claims.

We claim:

1. A semiconductor memory having an array of memory cells organized in rows and columns, said memory device further comprising:

a plurality of redundant memory elements, at least one of said redundant memory elements including twice as many memory cells as at least one other of said redundant memory element;

programmed decode means for individually selecting each of said plurality of redundant memory elements; and programming means for programming said programmed decode means for replacing cells in a first identified array defect with said at least one redundant element and cells in a second identified array defect with said at least one other redundant element.

2. The semiconductor memory of claim 1, wherein said first identified array defect affects cells on twice as many array lines as said second identified array defect.

3. The semiconductor memory of claim 2, wherein a third of said redundant elements includes twice as many memory cells as said at least one redundant element, said programming means programming said programmed decode means for replacing cells in a third identified array defect with said third redundant element.

4. The semiconductor memory of claim 3, wherein said third identified array defect affects cells on twice as many array lines as said first identified array defect.

5. The semiconductor memory of claim 4, wherein the array lines are word lines.

6. The semiconductor memory of claim 2, wherein the second defect affects two word lines.

7. The semiconductor memory of claim 5, wherein said plurality of redundant elements are in one sub-array and at least one repaired defect is in another sub-array.

* * * * *